(12) United States Patent
Lu

(10) Patent No.: US 8,987,579 B2
(45) Date of Patent: Mar. 24, 2015

(54) POWER CONVERTER

(75) Inventor: Cheng-Yi Lu, West Hills, CA (US)

(73) Assignee: Aerojet Rocketdyne of DE, Inc., Canoga Park, CA (US)

(*) Notice: Subject to any disclaimer, the term of this patent is extended or adjusted under 35 U.S.C. 154(b) by 867 days.

(21) Appl. No.: 13/101,742

(22) Filed: May 5, 2011

(65) Prior Publication Data

US 2012/0279543 A1 Nov. 8, 2012

(51) Int. Cl.
*G21C 3/40* (2006.01)
*H01L 35/30* (2006.01)
*G21C 15/257* (2006.01)
*G21D 7/04* (2006.01)

(52) U.S. Cl.
CPC .............. *H01L 35/30* (2013.01); *G21C 15/257* (2013.01); *G21D 7/04* (2013.01); *Y02E 30/40* (2013.01)
USPC ....................................................... 136/202

(58) Field of Classification Search
CPC ......... H01L 35/28; H01L 35/30; H01L 35/32; H01L 35/34; F04N 5/025
USPC ................................. 136/208–210
See application file for complete search history.

(56) References Cited

U.S. PATENT DOCUMENTS

| | | | |
|---|---|---|---|
| 3,728,160 A * | 4/1973 | DesChamps et al. | 136/202 |
| 3,897,271 A * | 7/1975 | Kim | 136/202 |
| 4,427,838 A * | 1/1984 | Goldman | 136/248 |
| 5,095,707 A | 3/1992 | Eck | |
| 5,299,242 A | 3/1994 | Jacox et al. | |
| 5,563,368 A | 10/1996 | Yamaguchi | |
| 7,273,981 B2 | 9/2007 | Bell | |
| 7,767,903 B2 | 8/2010 | Marshall | |
| 2003/0000063 A1* | 1/2003 | Tsegga et al. | 29/469.5 |
| 2004/0031514 A1 | 2/2004 | Bell | |
| 2007/0018038 A1 | 1/2007 | Jarmon et al. | |
| 2007/0125413 A1 | 6/2007 | Olsen et al. | |
| 2007/0157922 A1 | 7/2007 | Radhakrishnan et al. | |
| 2008/0035195 A1 | 2/2008 | Bell | |
| 2008/0083447 A1 | 4/2008 | Sienel | |
| 2008/0092940 A1* | 4/2008 | Nakajima | 136/206 |
| 2008/0121389 A1 | 5/2008 | Zilllmer | |
| 2008/0264473 A1* | 10/2008 | Cumpston et al. | 136/251 |
| 2008/0271777 A1* | 11/2008 | Stoner et al. | 136/252 |
| 2010/0006132 A1 | 1/2010 | Hodes | |
| 2010/0147351 A1* | 6/2010 | Takahashi | 136/205 |
| 2012/0073276 A1* | 3/2012 | Meisner et al. | 60/320 |
| 2012/0297755 A1* | 11/2012 | Adldinger et al. | 60/320 |

OTHER PUBLICATIONS

Motieifar et al., Study of the Transient Behavior of Microfluidic Heat Sinks, Thermal and Thermomenchanical Phenomena in Electronic Systems, IEEE Intersociety Conference on, pp. 1-8, conference dates Jun. 2-5, 2010.*
Henerson et al., High Temperature Thermoelectric Research, Sixth Quarterly Progress Report, Mansanto REsearch Corporation, pp. 1-89 (1963).*

* cited by examiner

*Primary Examiner* — Jayne Mershon
(74) *Attorney, Agent, or Firm* — Joel G Landau

(57) ABSTRACT

A power converter is provided and includes a heat collector surface, n- and p-legs formed of n- and p-type thermoelectric materials, respectively, which are each disposed in thermal communication with the heat collector surface, parallel electric busses electrically coupled to the n- and p-legs and a housing, which is electrically decoupled from the busses, to support the heat collector surface at a predefined distance from a heat pipe.

1 Claim, 5 Drawing Sheets

POWER CONVERTER

BACKGROUND OF THE INVENTION

Aspects of the invention are directed to a thermoelectric power converter support structure for a heat pipe cooled reactor.

A heat pipe cooled reactor (HPCR) is a fission heat source for a <30 kWt space power system. To optimize a size and mass of the HPCR, a diameter of the potassium or sodium (K or Na) heat pipe will be designed to be relatively long and relatively narrow with the K or Na vapor contained therein. In an example, a 20 kWt sized HPCR may have 18 heat pipes with each heat pipe being several meters long and 1-1.5 cm, in outside diameter. For each heat pipe, a plurality of thermoelectric power converters (TECs) may be operably coupled to the heat pipe surface for power generation along a condenser section thereof. In each case, a hot side of the TEC couples receives heat from the heat pipe condenser surface via various heat transfer mechanisms and the TEC produces electricity in accordance with known thermoelectric principles methods.

With such long and small diameter heat pipes, surviving launch loads and accommodating thermal expansion during HPCR startup must be considered.

BRIEF DESCRIPTION OF THE INVENTION

A power converter is provided and includes a heat collector surface, n- and p-legs formed of n- and p-type thermoelectric materials, respectively, which are each disposed in thermal communication with the heat collector surface, parallel electric busses electrically coupled to the n- and p-legs and a housing, which is electrically decoupled from the busses, to support the heat collector surface at a predefined distance from a heat pipe.

A power converter is provided and includes a plurality of heat collector surfaces, a plurality of thermoelectric couples, each thermoelectric couple including an n- and p-leg formed of n- and p-type thermoelectric materials, respectively, which are each disposed in thermal communication with a respective one of the heat collector surfaces, two parallel electric busses electrically coupled to the n- and p-legs of pairs of the thermoelectric couples and a housing, which is electrically decoupled from the busses, to support the heat collector surfaces about and at a predefined distance from a heat pipe.

A power converter is provided and includes four heat collector surfaces, four thermoelectric couples, each thermoelectric couple including an n- and p-leg formed of n- and p-type thermoelectric materials, respectively, which are each disposed in thermal communication with a respective one of the heat collector surfaces, two parallel electric busses electrically coupled to the n- and p-legs of pairs of the thermoelectric couples and a housing, which is electrically decoupled from the busses, to support the four heat collector surfaces about and at a predefined distance from a heat pipe.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Effectiveness of a heat pipe cooled reactor (HPCR) for power generation depends on the efficient transport of thermal energy through long and slim heat pipes. However, the power conversion section, including the heat pipes, needs to survive launch and operate in space. The present invention provides for a design of a support structure with heat pipe interfaces that will allow the heat pipes to survive launch loads and thermal expansion during on-orbit startup.

Figure 1:
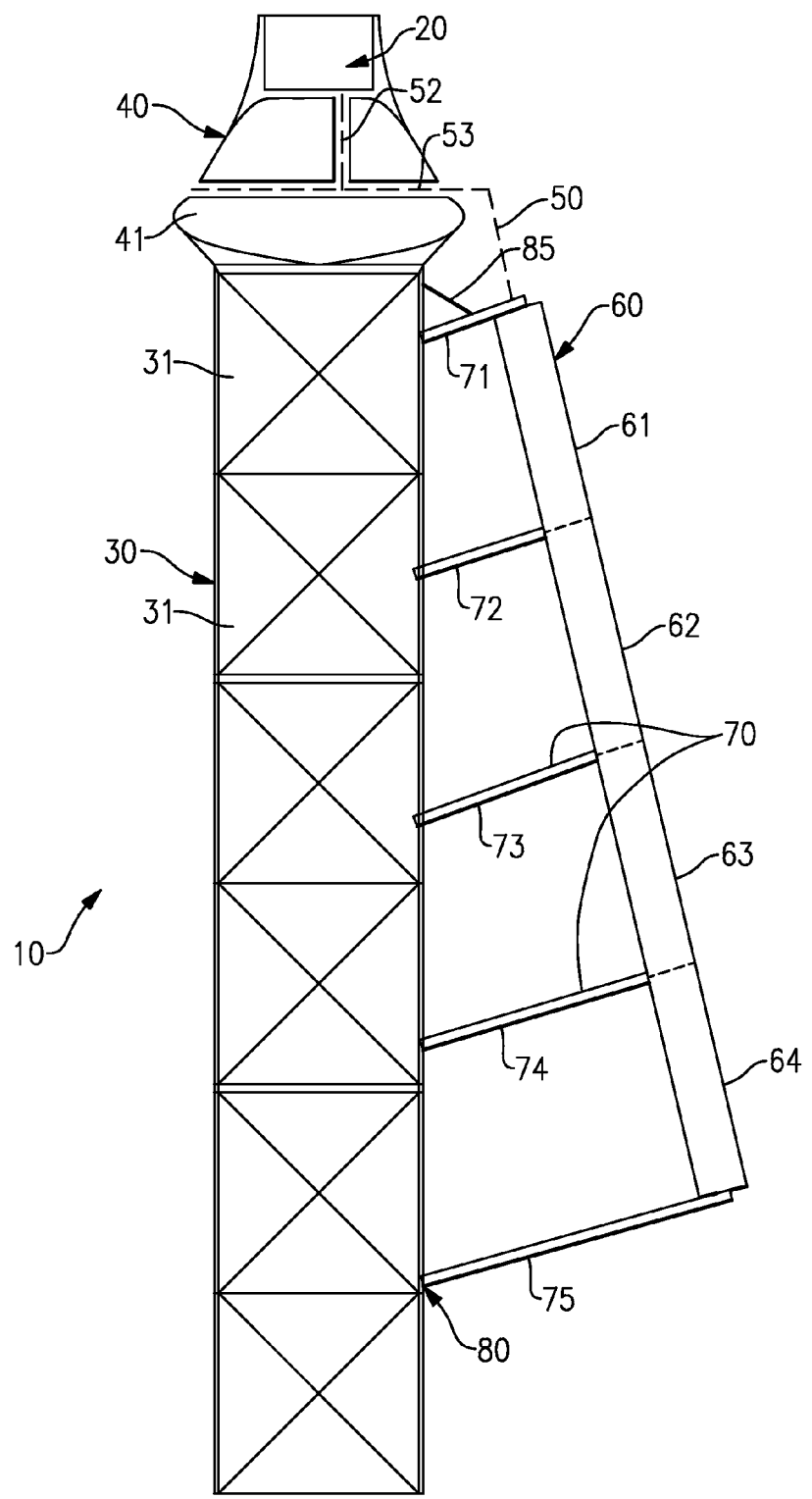
FIG. 1 is a side view of a thermoelectric power converter support structure.
Figure 2:
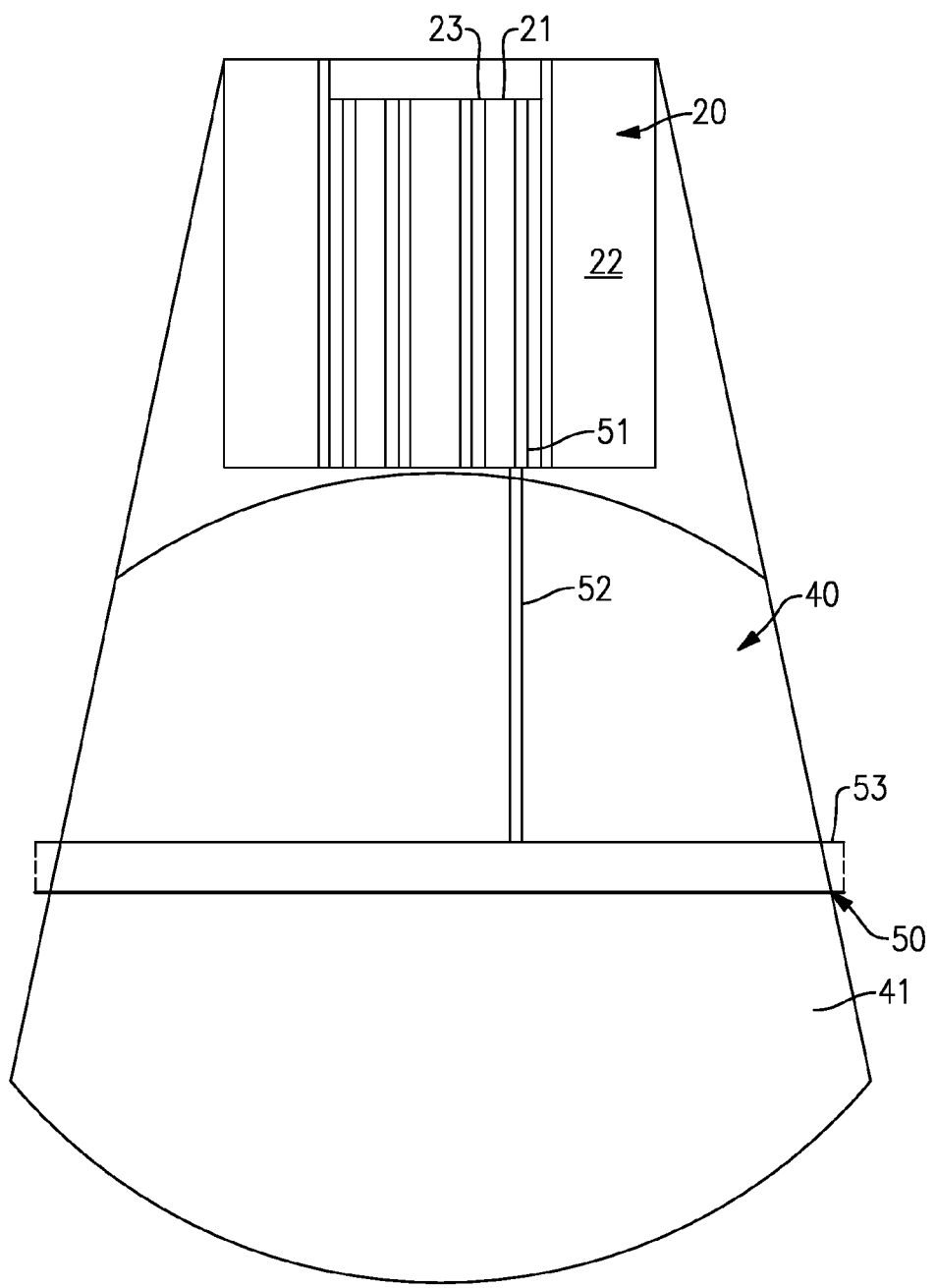
FIG. 2 is an enlarged side view of a reactor core and shield structure of the thermoelectric power converter support structure of FIG. 1.
Figure 3:
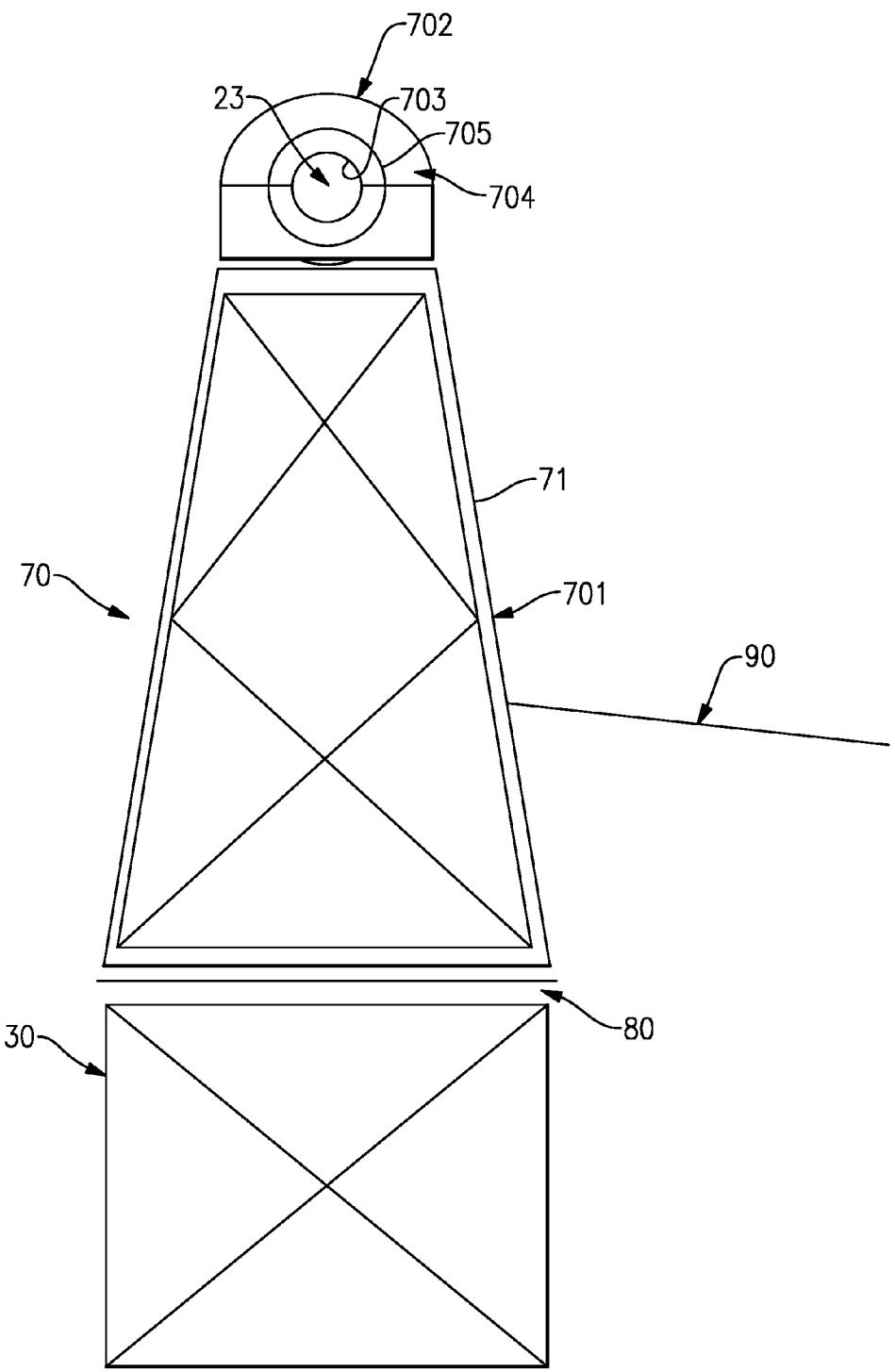
FIG. 3 is an axial view of the thermoelectric power converter support structure of FIG. 1.

With reference to FIGS. 1-3, an apparatus 10 is provided. The apparatus 10 includes a reactor core 20, a boom structure 30 and a shield assembly 40. The boom structure 30 has an elongate shape and includes a series of lattice bodies 31. The shield assembly 40 includes a radiation shield 41 and is supportively interposed between the reactor core 20 and the boom structure 30. As shown in FIG. 2, the reactor core 20 may include a fission reactor or another similar type of heat generating device whereby heat produced from the nuclear reactions of fissionable material 21 generates a substantial amount of heat in the interior 22. This heat is transferred to media 23. Media 23 may include, for example, sodium (Na) and/or potassium (K).

The apparatus 10 further includes a heat pipe 50, which is disposed in thermal communication with the reactor core 20, which is formed to contain the media 23 therein, and which may be plural in number. Each heat pipe 50 has a first section 51, a second section 52 and a third section 53. The first section 51 is an evaporator section located at the reactor core 20 where the media 23 is heated. The second section 52 is an adiabatic section located mainly inside shield assembly 40. The third section 53 is a condenser section and extends axially away from the shield assembly 40. In an exemplary embodiment, eighteen heat pipes 50 would be provided with each condenser section substantially evenly distributed around a bottom circumference of the radiation shield 41 of the shield assembly 40. This forms the frustum of a cone for a radiator geometry based upon the radiation shield 41 having a shadow cone half angle of about 11.1 degrees. Of course, it is to be understood that more or less heat pipes 50 may be provided with similar or different configurations relative to the shield assembly 40.

The apparatus 10 still further includes two or more thermoelectric power converters 60, which are each operably coupled to a respective one of the heat pipes 50, three or more struts 70, which are each supportively coupled to the heat pipe 50 at opposite ends of each of the power converters 60 and hinge joints 80. The hinge joints 80 rotatably couple the struts 70 to the boom structure. At the least one of the hinge joints 80 is also spring loaded to bias the struts 70 to resist rotation due to axial thermal expansion of the heat pipe 50. Where the heat pipe 50 is plural in number, the apparatus 10 may further include lateral support structures 90 that are supportively coupled to adjacent struts 70 of adjacent heat pipes 50.

In accordance with an exemplary embodiment, four thermoelectric power converters 60 are operably coupled to the heat pipe 50 in series as shown in FIG. 1 so that they serially extend away from the shield assembly 40 in a line of first, second, third and fourth power converters 61, 62, 63, 64. In this case, five struts 70 are supportively coupled to the heat pipe 50 with a first strut 71 at a lead end of the first (or lead or uppermost) power converter 61, a second strut 72 between the first and second power converters 61 and 62, a third strut 73 between second and third power converters 62 and 63, a fourth strut 74 between third and fourth power converters 63 and 64 and a fifth strut 75 at a trailing end of the fourth (or trailing or bottom-most) power converter 64. Each power converter 60 converts heat transported along the heat pipe 50 into electricity in accordance with known devices and methods.

In the embodiment with four power converters 60 and five struts 70 for each heat pipe 50, the hinge joint 80 for the fifth strut 75 may be spring loaded. The spring loading biases the strut 70 in a direction whereby the strut 70 resists axial thermal expansion of the heat pipe 50 and thereby provides an axial load on the heat pipe 50 and the struts 70 during, for example, launch operations. An end stop 85 is disposed at the first strut 71 to limit strut 70 rotation due to the spring loading. The end stop 85 may therefore be formed of an elastic element and/or compliant materials.

As shown in FIG. 3, each strut 70 includes an elongate member 701 and a flanged interface 702. The elongate member 701 is made of various materials, such as titanium and/or titanium alloys, and has a structural configuration that may be similar to those of the lattice bodies 31 of the boom structure 30. The flanged interface 702 is configured for receiving the corresponding heat pipe 50 therethrough and is disposed at a distal end of the elongate member 701. In accordance with the embodiment shown in FIG. 3, the elongate member 701 may have an A-shaped frame configuration with a wide base, which is attached at hinge joint 80 to the boom structure 30, and the distal end being narrow.

The flanged interface 702 is formed to define an aperture 703 through which the heat pipe 50 extends. A size and shape of the aperture 703 is substantially similar to or very slightly larger than the heat pipe 50 to ensure that the flanged interface may be tightly fit about the heat pipe 50 while also allowing for slight radial thermal expansion. As shown in FIG. 3, the flanged interface 702 may have a split bolt construction and may include a ball pivot joint 704 that permits thermal expansion of the heat pipe 50 without applying substantially structural loading to the heat pipe 50. The ball pivot joint 704 may include an insert 705, such as a zircon insert or an insert formed of another similar material, to thermally insulate the strut 70 from the heat pipe 50.

Figure 4:
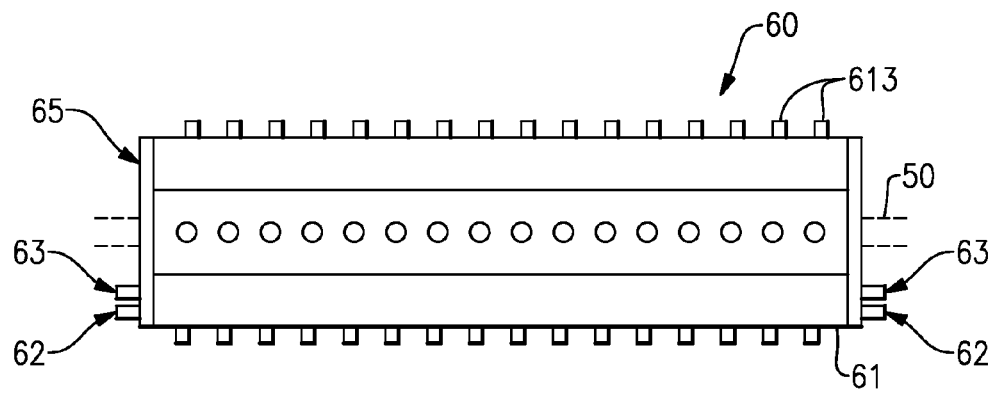
FIG. 4 is a side view of a power converter.
Figure 5:
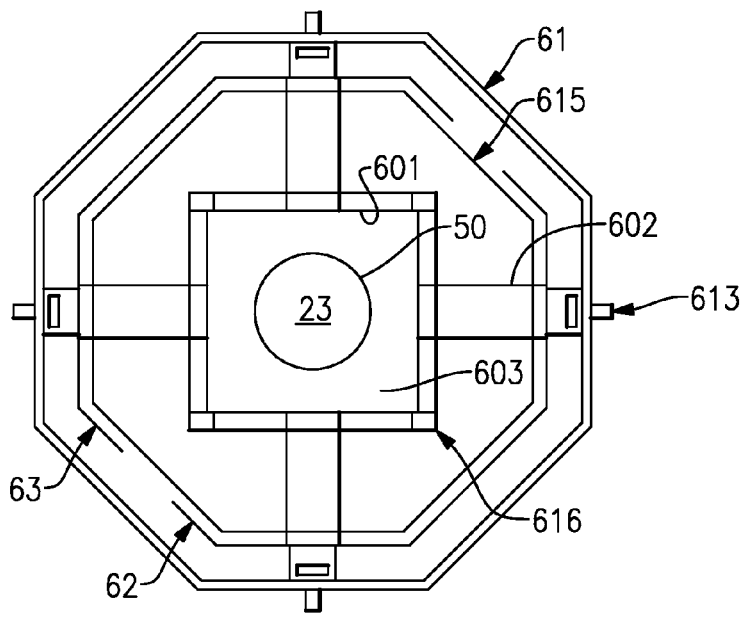
FIG. 5 is an axial view of the power converter of FIG. 4.
Figure 6:
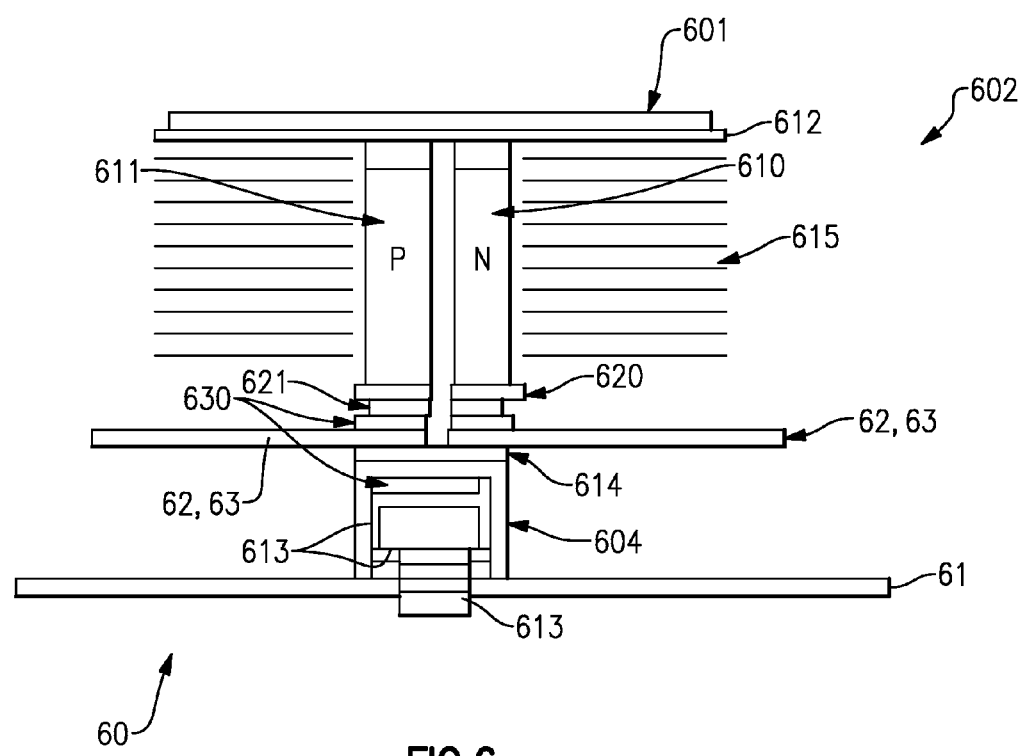
FIG. 6 is an enlarged axial view of the power converter of FIG. 4.

With reference to FIGS. 4-6, one of the power converters 60 is illustrated as having a design based on operation in the vacuum of space. As shown in FIG. 4, the power converter 60 includes a housing 61 with two parallel electrical busses 62, 63, which may be made from copper or another similar material. The housing 61 is electrically decoupled from the two parallel electric busses 62, 63. Each of the two parallel electric busses 62, 63 has thirty-two couples connected in series that provide redundancy in power output from open circuit failures for the power converter 60. The power converter 60 further includes end plates 65, which may be made from aluminum and/or aluminum alloy, and which may include a flange for attachment to the adjacent strut 70, such that the power converter 60 need not be supported on the heat pipe 50.

An interface between an outside diameter of the heat pipe 50 at the third (i.e., condenser) section 53 and heat collector surfaces 601 of power converter 60 is illustrated in FIGS. 5 and 6. In an exemplary embodiment, four thermoelectric couples 602 are mounted circumferentially around the heat pipe 50 to form a radiant heat receiver cavity 603 and to be electrically coupled to the two parallel electric busses 62, 63. Thermal energy is radiated from the exterior surface of the heat pipe 50 to the heat collector surfaces 601 on the four thermoelectric couples 602. High emissivity coatings may be disposed on the heat pipe 50 outside diameter and the heat collector surfaces 601 to minimize temperature drops across the radiant heat receiver cavity 603 and to maximize hot junction temperatures of the thermoelectric couples 602.

As shown in FIG. 6, the thermoelectric couple 602 may include a segmented n-leg 610 formed of n-type thermoelectric material and a segmented p-leg 611 formed of p-type thermoelectric material, which are each respectively disposed in thermal communication with or otherwise bonded to the heat collector surface 601, which may be formed of nickel, and which provides a high temperature electrode function. The n-leg 610 and the p-leg 611 are electrically coupled to the two parallel electric busses 62, 63 by way of the electrode leads 620, 621, respectively. A thermal expansion compensator 630 is provided on either side of the two parallel electric busses 62, 63 in accordance with known devices and methods.

A face of the heat collector surface 601 may be treated to form a black chromium oxide face that is consistent with a thermal emissivity value of about 0.9. An alumina spacer or insulator 612 is provided on the reverse side of the heat collector surface 601 to electrically isolate the heat collectors of the n-leg 610 and the p-leg 611 from each other and their respective support frames. The thermoelectric couple 602 is supported at a cold end 604 thereof by a fastening element 613, such as a titanium screw and a titanium nut attaching the titanium screw to the housing 61. Alumina insulators 614 provide electrical isolation of the housing 61 from the thermoelectric circuit voltage. Multi-foil thermal insulation 615 is disposed proximate to the heat collector surface 601 and significantly reduces thermal losses from the heat collector surface 601 to the cold side components and improves overall system efficiency.

For the segmented couple of the power converter 60 shown in FIGS. 5 and 6, a need for inclusion of the two parallel electrical busses 62, 63 may be a function of the view angle of the housing 61 to the thermal sink of space as seen from outer surfaces of the housing 61. That is, the circumferential temperature distribution on the outer housing wall may be asymmetric due to surfaces of two of the four thermoelectric couples 602 having a limited view to space and therefore a higher background sink temperature. This geometry will result in higher cold junction temperatures on the thermoelectric couples 602 located on that side of the housing 61 with the limited view to space versus the outside surfaces of the housing 61 that have a full view to the thermal sink of space and thereby lower cold junction temperatures. By electrically connecting the two parallel electric busses 62, 63 in series on adjacent heat pipes 50, an averaged couple voltage output can be achieved.

In accordance with further embodiments, the heat pipe 50 may have an operating temperature of about 1100 K and the power converters 60 are configured to operate at these temperatures with the housing 61 supporting and positioning the thermoelectric couples at an appropriate distance from the heat pipe 50. In total, the housing 61 may include 64 thermoelectric couples 602 that are mechanically fastened to housing 61. The housing 61 geometry can be eight-sided, as shown in FIG. 5, or the housing 61 may have other appropriate shapes.

There may be a total of 16 rows of four thermoelectric couples 602 on a 3.81 cm axial pitch in the housing 61. The four-couple assemblies form the radiant heat receiver cavity 603 with a substantially square shape of four heat collector surfaces 601 surrounding the heat pipe 50. Here, two of the four heat collector surfaces 601 are coupled to one of the two parallel electric busses 62, 63, the other two are coupled to the other of the two parallel electric busses 62, 63 and the two parallel electric busses 62, 63 are arranged about the heat pipe 50 in a diagonal arrangement relative to the squared heat collector surfaces 601 to account for the asymmetry of the circumferential temperature distribution. The housing 61 also contains an internal support frame 616 for the thermoelectric couples, the multi-foil thermal insulation 615 (in 53 or 60 layers) and an outer support frame for the insulation, as well as the two parallel electrical busses 62, 63. The multi-foil thermal insulation 615 protects the end plates 65 from high temperatures in the radiant heat receiver cavity 603.

In accordance with a further embodiment, each of the two parallel electric busses 62, 63 may have a 5-sided bracket shape with the respective concave sides facing radially inwardly toward the heat pipe 50 and the respective convex sides facing radially outwardly away from the heat pipe 50.

The outer wall of the housing 61 is secured to each end plate 65 with no hermetic seal required. The end plates 65 may include a central cavity for a Zircon insert that has a center hole for receiving the heat pipe 50 in a similar manner as the flanged interface 702 of each of the strut 70. This Zircon insert may include stabilized zirconia and provides thermal protection of the aluminum structural elements in the end plates 65. An attachment bracket located on an exterior surface of each end plate 65 connects the housing 61 to the adjacent strut 70.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A space based heat pipe cooled reactor, comprising:
    a reactor core;
    a heat pipe disposed in a vacuum, the heat pipe in thermal communication with the reactor core;
    a power converter having
        a plurality of heat collector surfaces arranged about the heat pipe to form a radiant heat receiving cavity, wherein the vacuum is between the heat pipe and the plurality of heat collector surfaces,
        n- and p-legs formed of n- and p-type thermoelectric materials, respectively, which are each disposed in thermal communication with the heat collector surface,
        parallel electric busses electrically coupled to the n- and p-legs and
        a housing, which is electrically decoupled from the busses, configured to support the heat collector surfaces at a predefined distance from a heat pipe.

* * * * *